United States Patent
Blair et al.

(10) Patent No.: US 6,795,461 B1
(45) Date of Patent: Sep. 21, 2004

(54) OPTOELECTRIC MODULE

(76) Inventors: Thomas H. Blair, 117 S. Bernal Rd., San Jose, CA (US) 95119; Phillip J. Edwards, 6721 Positano La., San Jose, CA (US) 95138; Siegfried Fleischer, 106470 Rosewood Rd., Cupertino, CA (US) 95014; Michael S. Lebby, 30 N. La Barge Rd., Apache Junction, AZ (US) 85219; Bradley S. Levin, 628 Forest Ave., Apt. C, Palo Alto, CA (US) 94301; Oliver W. Northup, 1336 Gilmore St., Mountain View, CA (US) 94040; Michael M. O'Toole, 5913 Foligno Way, San Jose, CA (US) 95138; Joseph John Vandenberg, 415 N. Lark Ellen Ave., West Covina, CA (US) 91791; Brett M. Zaborsky, 1301 Hollydale Dr., San Jose, CA (US) 95122

( * ) Notice: Subject to any disclaimer, the term of this patent is extended or adjusted under 35 U.S.C. 154(b) by 271 days.

(21) Appl. No.: 10/128,383

(22) Filed: Apr. 23, 2002

Related U.S. Application Data

(60) Provisional application No. 60/285,732, filed on Apr. 23, 2001.

(51) Int. Cl.[7] .................................................. H01S 3/04
(52) U.S. Cl. ............................ 372/36; 372/29; 372/30; 372/31; 372/38; 372/43; 372/50; 372/101; 372/109

(58) Field of Search ........................... 372/29, 30, 31, 372/36, 38, 43, 50, 101, 109; 385/88–93, 147; 257/81, 99, 98, 432–434; 359/15, 19

(56) References Cited

U.S. PATENT DOCUMENTS

| | | | | |
|---|---|---|---|---|
| 5,838,703 A | * | 11/1998 | Lebby et al. | 372/43 |
| 6,302,596 B1 | * | 10/2001 | Cohen et al. | 385/93 |
| 6,654,399 B1 | * | 11/2003 | Kimura et al. | 372/50 |
| 6,661,951 B1 | * | 12/2003 | Blair et al. | 385/33 |
| 6,663,296 B1 | * | 12/2003 | Blair et al. | 385/92 |

* cited by examiner

*Primary Examiner*—Wilson Lee
*Assistant Examiner*—Delma R. Flores-Ruiz
(74) *Attorney, Agent, or Firm*—Parsons & Goltry; Robert A. Parsons; Michael W. Goltry

(57) ABSTRACT

An optoelectric module includes a cylindrical ferrule defining an optical axis and having a first end constructed to receive an optical fiber aligned along the optical axis. A TO-can is positioned within the ferrule and has a first end with an optical element therein for conducting light therethrough. A base is affixed to the second end of the TO-can and to the second end of the ferrule. A laser is mounted within the TO-can so that light generated by the laser is directed through the optical element along the optical axis. A laser driver is mounted on the base and electrically connected to the laser. External connections to the laser driver are completed by either electrical traces on a surface of the base, vias through the base, or flexible leads mounted on the base.

29 Claims, 10 Drawing Sheets

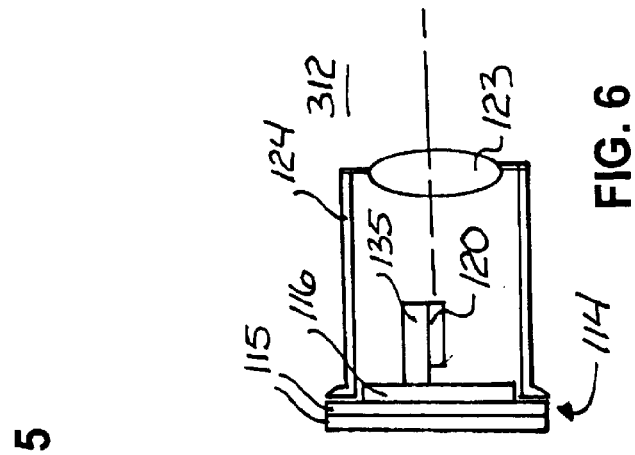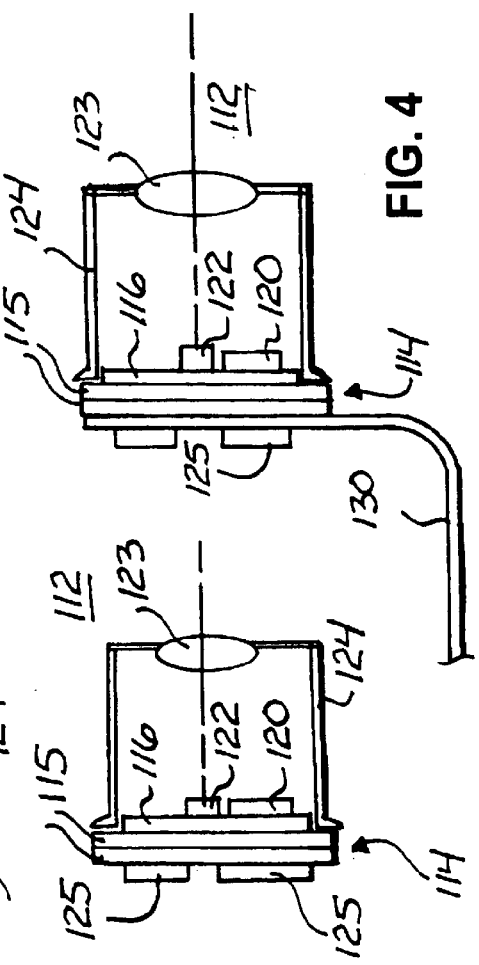

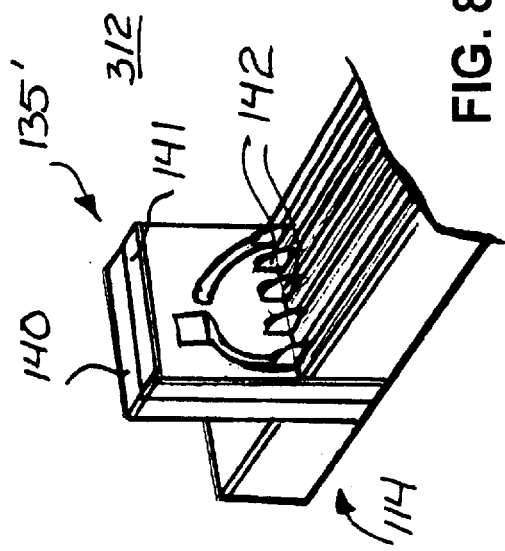
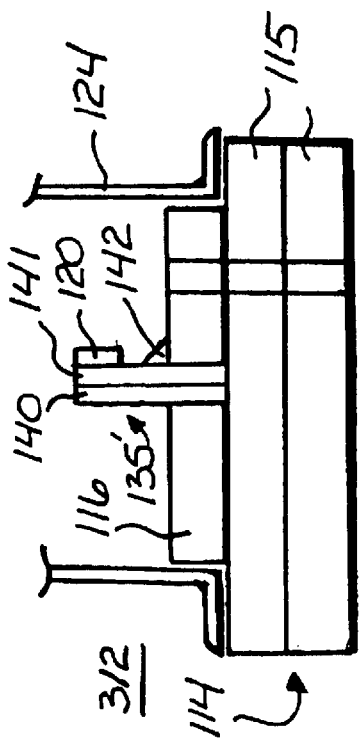
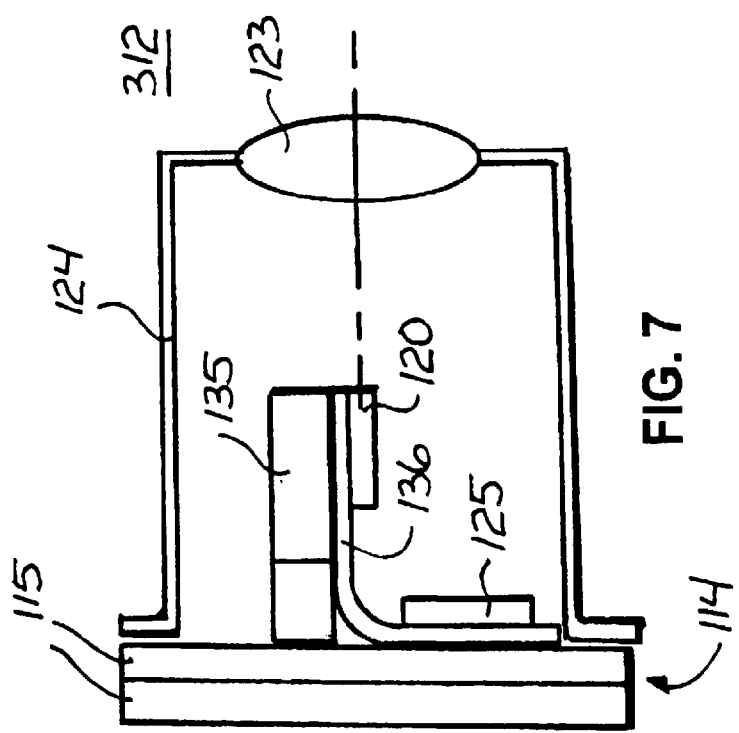

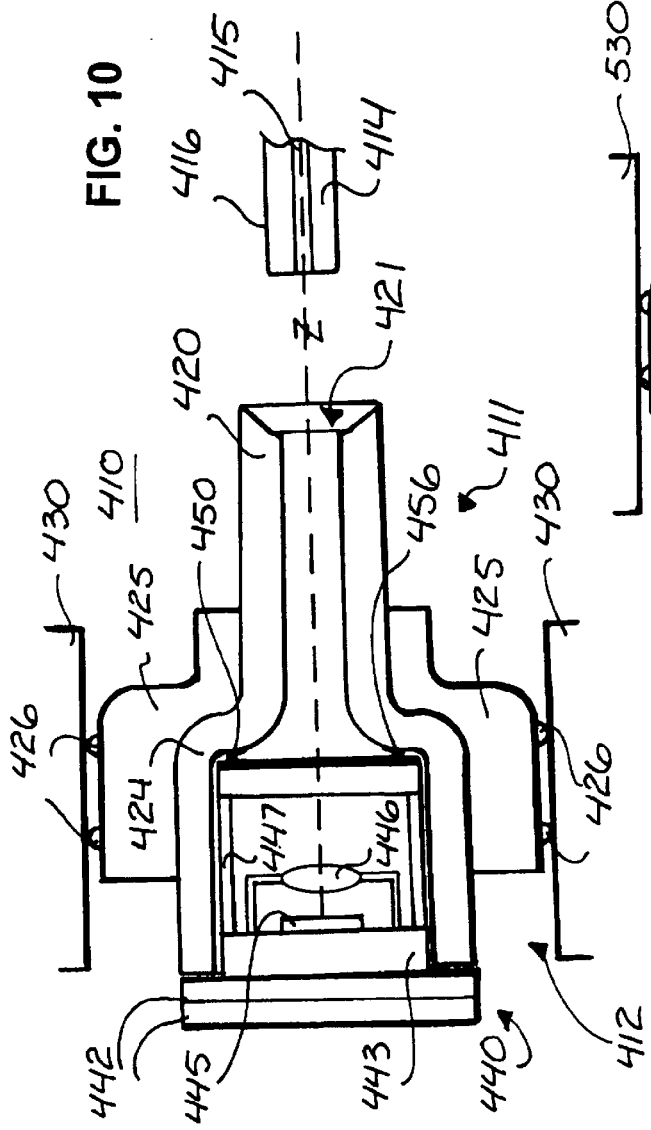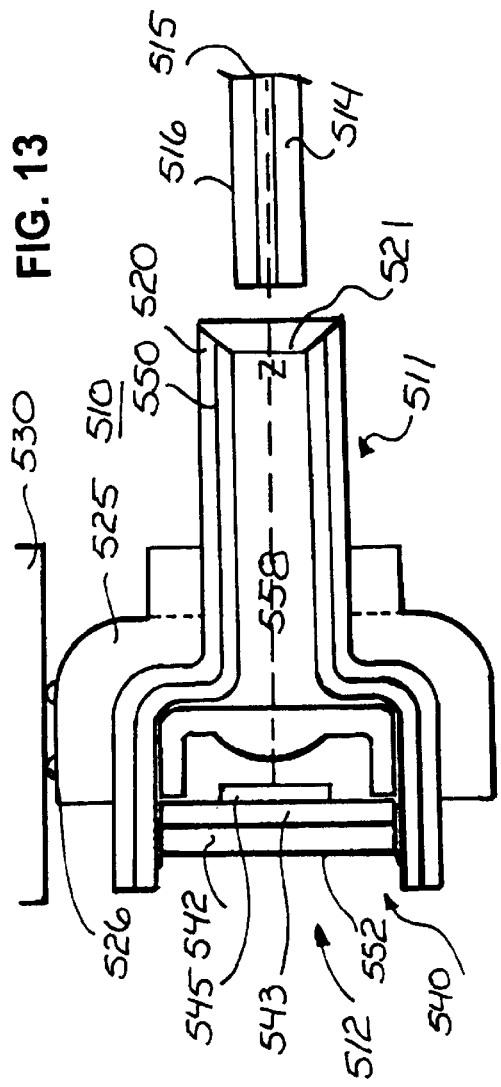

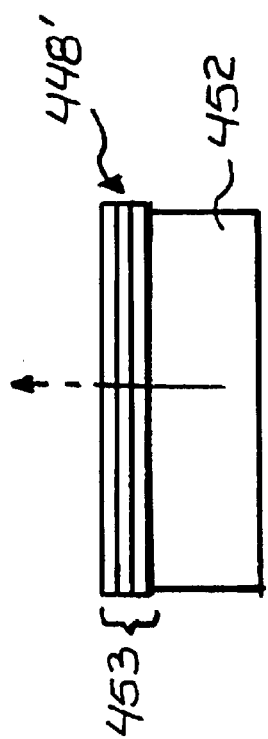
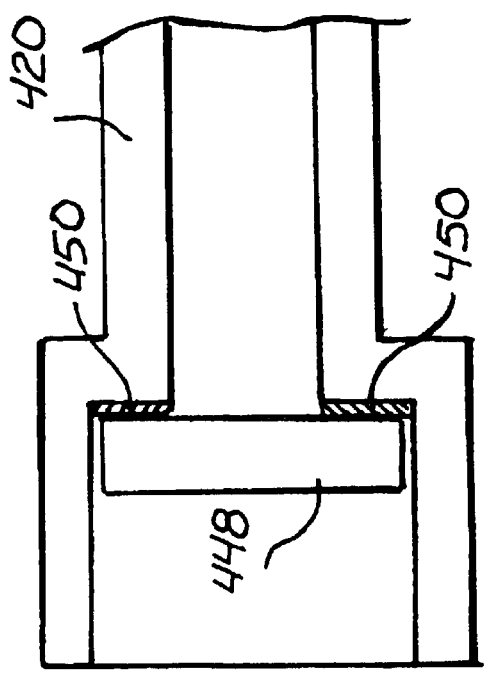

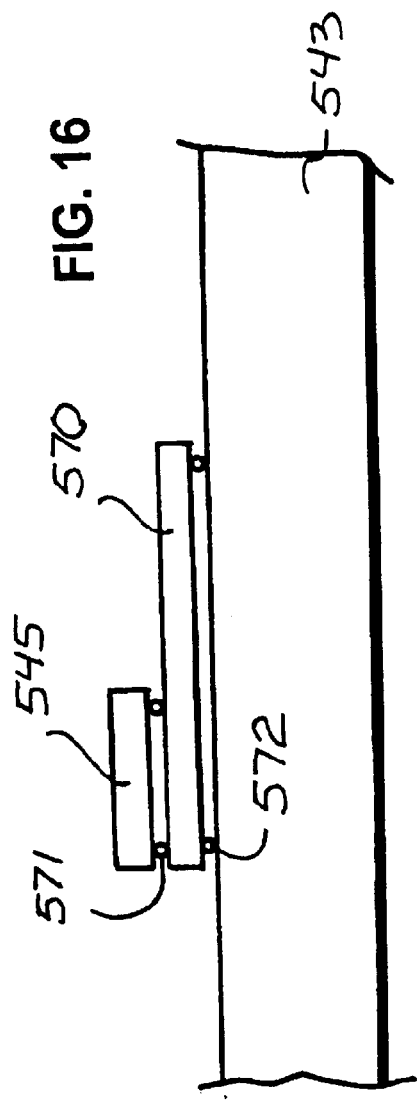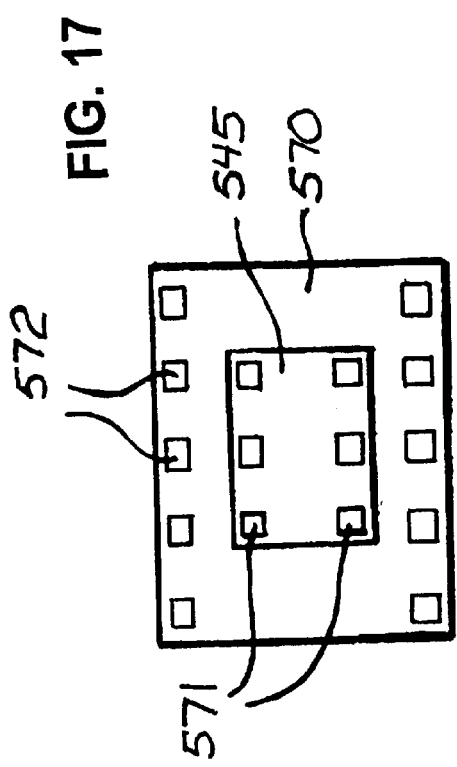

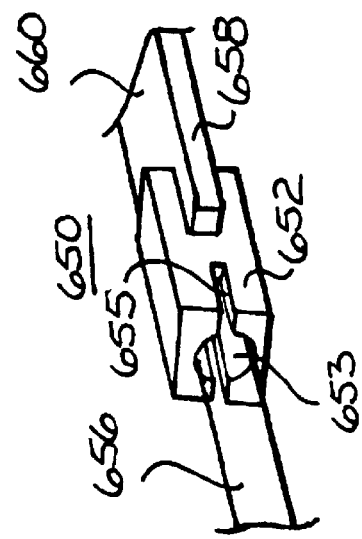
FIG. 19
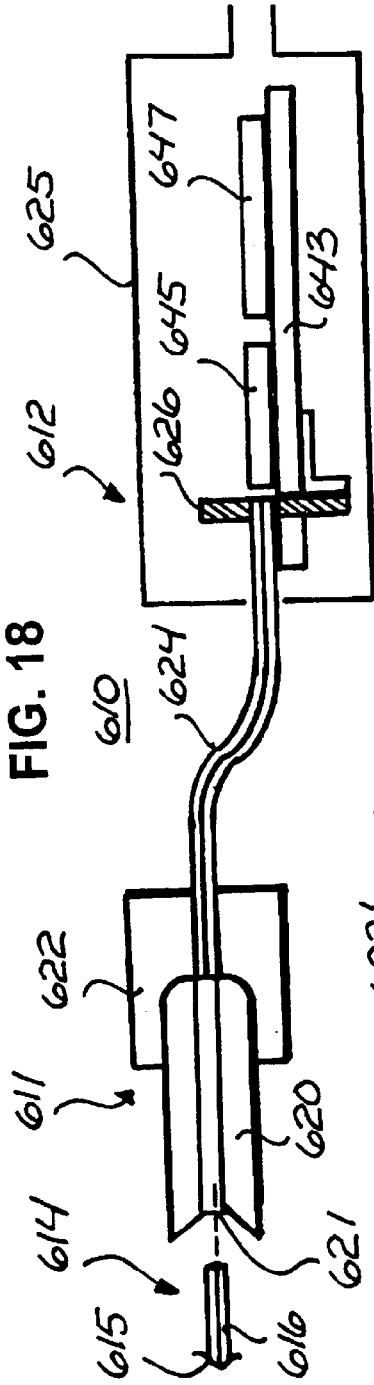
FIG. 18
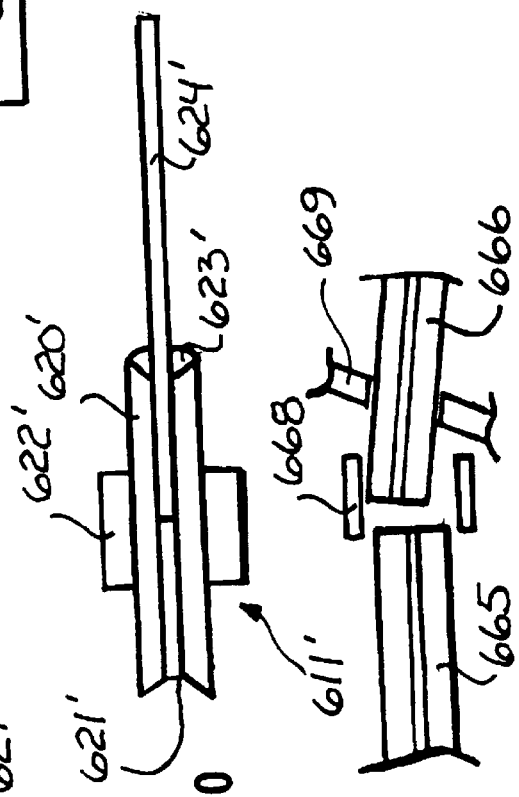
FIG. 20
FIG. 21

OPTOELECTRIC MODULE

CROSS-REFERENCE TO RELATED APPLICATION

This application claims the benefit of U.S. Provisional Application No. 60/285,732, filed 23 Apr. 2001.

FIELD OF THE INVENTION

This invention relates to optical-to-electrical and electrical-to-optical modules and more particularly to electrical mounting features in such modules.

BACKGROUND OF THE INVENTION

In optical-to-electrical and electrical-to-optical (hereinafter "optoelectric") modules used in the various communications fields, one of the most difficult problems that must be solved is the electrical interconnection of the various components and the shielding of the module to prevent radiation, (e.g., electromagnetic interference (EMI)) into or out of the module. Providing this efficient interconnection and shielding requires very precise assembly procedures. Here it will be understood by those skilled in the art that the term "light", as used throughout this disclosure, is a generic term which includes any electromagnetic radiation that can be modulated and transmitted by optical fibers or other optical transmission lines.

Much of the optoelectric module fabrication difficulty and expense is due to mounting and shielding difficulties of optical components, such as lasers, light emitting diodes, photodiodes, etc. Generally, there are two types of lasers that are used in optoelectric modules, edge emitting lasers and surface emitting lasers. Edge emitting lasers emit light in a path parallel to the mounting surface while surface emitting lasers emit light perpendicular to the mounting surface. The light from either of the lasers must then be directed into an optical fiber for transmission to a remotely located light receiver (i.e., a photodiode or the like). Lens systems are used at both ends of the optical fiber to direct light from a light generating component into the optical fiber and to direct light from the optical fiber onto a light sensing component. The apparatus used to mount the optical components and the lens systems can have a substantial effect on the construction of the optical systems and the assembly procedures for the optical systems. Also, the mounting structure for the optical components and the lens system must be very rugged and stable so that alignment is not disturbed by use or temperature changes. Further, the entire module must be shielded from external signals and the like and to prevent radiation to other external devices or modules.

It would be highly advantageous, therefore, to remedy the foregoing and other deficiencies inherent in the prior art.

Accordingly, it is an object the present invention to provide new and improved optical component mounting and interconnect apparatus.

Another object of the present invention is to provide new and improved optical component mounting and interconnect apparatus which is rugged and stable.

Another object of the present invention is to provide new and improved optical component mounting and interconnect apparatus which is shielded to prevent radiation into and/or out of the module.

And another object of the present invention is to provide new and improved optical component mounting and interconnect apparatus which improve the fabrication efficiency and manufacturing capabilities of optoelectric modules.

Still another object of the present invention is to provide new and improved optical component mounting and interconnect apparatus which allows the use of a variety of optical components and component materials.

Still another object of the present invention is to provide new and improved component mounting and interconnect apparatus which is designed to reduce outside interference with the desired signal.

SUMMARY OF THE INVENTION

Briefly, to achieve the desired objects of the present invention in accordance with a preferred embodiment thereof, provided is a TO-can-type optoelectric assembly including a TO-can having a first end with an optical element therein for conducting light therethrough and a second end, the first and second ends defining an optical axis. A base is affixed to the second end of the TO-can and a laser is affixed to the base so that light generated by the laser is directed through the optical element in the first end generally along the optical axis. A laser driver is affixed to the base and electrically connected to the laser by either electrical traces on a surface of the base, vias through at least a portion of the base, or flexible leads mounted at least partially on the base, and external connections are made to the laser driver by either electrical traces on a surface of the base, vias through at least a portion of the base, or flexible leads mounted at least partially on the base.

The above and other objects of the present invention are further realized in accordance with another embodiment in which an optoelectric assembly includes a first semiconductor chip with one of a laser and an optical detector fabricated thereon. A second semiconductor chip includes one of a laser driver and an amplifier, depending upon the device fabricated on the first chip. The first semiconductor chip is mounted on the second semiconductor chip, by bump bonding or the like, so that the one of the laser and the optical detector are physically and electrically connected to the one of the laser driver and the amplifier, respectively. A base has the second semiconductor chip affixed thereto and includes external connections to the second semiconductor chip by either electrical traces on a surface of the base, vias through at least a portion of the base, flexible leads mounted at least partially on the base, combinations of the above, or similar structures.

The above and other objects of the present invention are further realized in accordance with another embodiment in which an optoelectric module includes a cylindrical ferrule defining an optical axis and having a first end constructed to receive an optical fiber aligned along the optical axis, A TO-can is positioned within the ferrule and has a first end with an optical element therein for conducting light therethrough with the first and second ends positioned along the optical axis. A base is affixed to the second end of the TO-can and to the second end of the ferrule. A laser is mounted on the base within the TO-can so that light generated by the laser is directed through the optical element in the first end generally along the optical axis. A laser driver is mounted on the base and electrically connected to the laser by either electrical traces on a surface of the base, vias through at least a portion of the base, or flexible leads mounted at least partially on the base and external connections are made to the laser driver by either electrical traces on a surface of the base, vias through at least a portion of the base, or flexible leads mounted at least partially on the base.

BRIEF DESCRIPTION OF THE DRAWINGS

The foregoing and further and more specific objects and advantages of the invention will become readily apparent to those skilled in the art from the following detailed description of a preferred embodiment thereof, taken in conjunction with the drawings in which:

FIG. 2 is a simplified sectional view of an optoelectric package in accordance with the present invention;

FIG. 3 is a simplified sectional view of the optoelectric package of FIG. 2 with electronics mounted on the reverse side;

FIG. 4 is a simplified sectional view of the optoelectric package of FIG. 2 with electronics mounted on the reverse side in a different embodiment;

FIG. 5 is a simplified sectional view of another optoelectric package in accordance with the present invention;

FIG. 6 is a simplified sectional view of another optoelectric package in accordance with the present invention;

FIG. 7 is a simplified sectional view illustrating a mounting of electronics in the package of FIG. 6;

FIG. 8 is a simplified perspective view of another embodiment for connecting electronics in accordance with the present invention;

FIG. 9 is an enlarged sectional view of the apparatus of FIG. 8;

FIG. 10 is a simplified sectional view of another embodiment of an optical/electrical module in accordance with the present invention;

FIG. 11 is a partial sectional view illustrating modifications to the optics of the embodiment of FIG. 10;

FIG. 12 is a sectional view of an optical filter/lens for use in the optics illustrated in FIG. 12;

FIG. 13 is a simplified sectional view of another embodiment of an optical/electrical module in accordance with the present invention;

FIG. 16 is a simplified side view of another embodiment of mounting structure for electronics in an optical/electrical module;

FIG. 17 is a view in top plan of the mounting structure of FIG. 16;

FIG. 18 is a simplified sectional view of another embodiment of an optical/electrical module in accordance with the present invention;

FIG. 19 is a perspective view of a portion of the structure of FIG. 18;

FIG. 20 is a sectional view of another portion of the structure of FIG. 18;

FIG. 21 is a simplified sectional view illustrating apparatus for optical alignment of optical fibers and the like;

FIG. 26 is a simplified sectional view of structure for aligning and joining sections of optical fiber and the like.

DETAILED DESCRIPTION OF THE DRAWINGS

Figure 1:
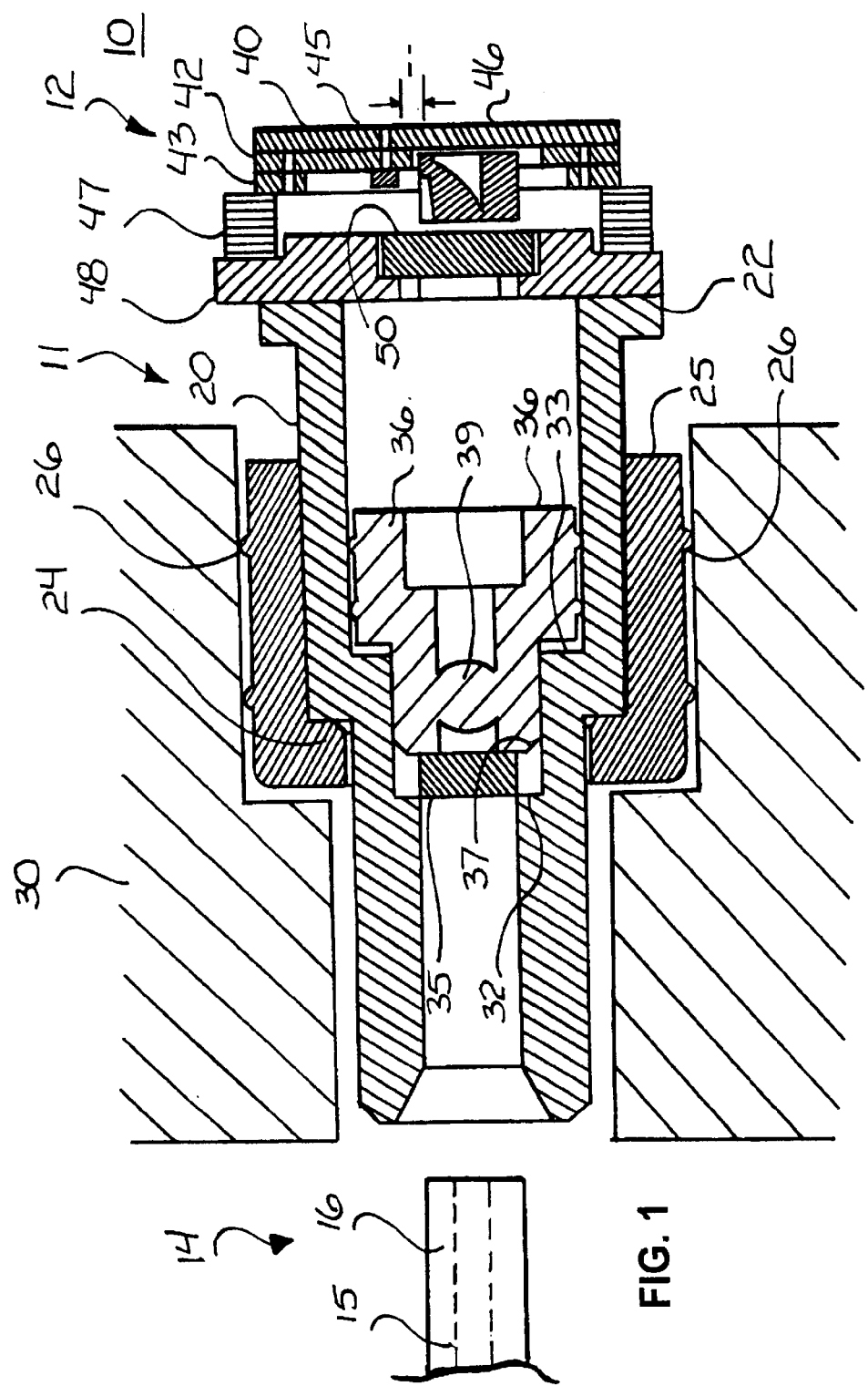
FIG. 1 is a sectional view of an optical/electrical module in accordance with the present invention.

Referring to FIG. 1, a sectional view of either an optical-to-electrical or electrical-to-optical (hereinafter referred to as optical/electrical) module 10 in accordance with the present invention. It will be understood by those skilled in the art that modules of the type discussed herein generally include a pair of channels, one of which receives electrical signals, converts the electrical signals to optical (light) beams by way of a laser or the like and introduces them into one end of an optical fiber, which then transmits the modulated optical beams to external apparatus. The second channel of the module receives modulated optical beams from an optical fiber connected to the external apparatus, conveys the modulated optical beams to a photo diode or the like, which converts them to electrical signals. In the following description, the apparatus and methods can generally be used in either of the channels but, since the optical portions of the two channels are substantially similar, only one channel will be discussed with the understanding that the description applies equally to both channels.

Module 10 of FIG. 1 includes a receptacle assembly 11 and an optoelectric package 12 aligned and affixed together, as will be disclosed in more detail below. Receptacle assembly 11 is designed to receive an optical fiber 14 in communication therewith, in a manner that will become clear presently. While optical fiber 14 is illustrated as a bare, unsupported fiber for simplicity, it will be understood that optical fibers are generally terminated in a ferrule or other structure specifically designed for plugging into receiving openings and that such structures are intended to be included herein. In this embodiment, optical fiber 14 is a single mode fiber (the use of which is one of the major advantages of the present invention) including a glass core 15 and a cladding layer 16. Receptacle assembly 11 includes an elongated cylindrical ferrule 20 defining a fiber receiving opening 21 at one end and a mounting flange 22 at the opposite end.

Ferrule 20 has a radially outward directed step 24 formed in the outer periphery to operate as a stop for a resilient sleeve 25. Sleeve 25 has an inwardly directed flange formed adjacent one end so as to engage step 24 and prevent relative longitudinal movement between ferrule 20 and sleeve 25. Sleeve 25 also includes radially outwardly directed ribs or protrusions 26 in the outer periphery which are designed to frictionally engage the inner periphery of a mounting housing 30. Thus, to easily and conveniently mount module 10 in housing 30, ferrule 20 with sleeve 25 engaged thereover is press-fit into the circular opening in housing 30 and frictionally holds module 10 in place. Preferably, sleeve 25 is formed, completely or partially, of some convenient resilient material and may be electrically conductive or non-conductive as required in the specific application.

Progressing from end 21 toward end 22, ferrule 20 has two radially outwardly directed steps 32 and 33. Step 32 provides a surface or stop for the mounting of an optical spacer 35 and step 33 provides a surface or a stop for the positioning of an optical lens assembly 36. In this preferred embodiment, lens assembly 36 is formed of plastic and may be, for example, molded to simplify manufacturing of module 10. It should be understood that the term "plastic" is used herein as a generic term to describe any non-glass optical material that operates to transmit optical beams of interest therethrough and which can be conveniently formed into lenses and the like. For example, in most optical modules used at the present time the optical beams are generated by a laser that operates in the infra-red band and any materials that transmit this light, including some oxides and nitrides, come within this definition.

Lens assembly 36 defines a central opening for the transmission of light therethrough from an end 37 to an opposite end 38. A lens 39 is integrally formed in the central opening a fixed distance from end 37. Lens assembly 36 is formed with radially outwardly projecting ribs or protrusions in the outer periphery so that it can be press-fit into ferrule 20 tightly against spacer 35. Thus, lens assembly 36 is frictionally held in place within ferrule 20 and holds spacer 35 fixedly in place. Also, lens 39 is spaced a fixed and known distance from spacer 35. In this preferred embodiment, optical fiber 14 in inserted into ferrule 20 so that glass core 15 buts against spacer 35, which substantially reduces or suppresses return reflections.

Optoelectric package 12 includes a base or support plate 40 and a mounting plate 42 positioned thereon. One or more spacer rings 43 may be positioned on plate 42 to provide sufficient distance for components mounted thereon. In this example a laser 45 is mounted on the upper surface of mounting plate 42 and positioned to transmit light generated therein to a lens block 46. Alternatively, laser 45 could be a photodiode or the like. Lens block 46 is mounted on mounting plate 42 by some convenient means, such as outwardly extending ears (not shown). A ring 47 is positioned on spacer rings 43 and a cap or cover 48 is affixed to ring 47. Generally, the entire assembly, including plate 40, mounting plate 42, spacer rings 43, ring 47 and cover 48 are fixedly attached together by some convenient means, such as welding, gluing, etc. so that laser 45 is enclosed in a hermetically sealed chamber. However, a hermetic seal is not necessary in many embodiments in which the laser or photodiode used is either separately sealed or is not sensitive to atmospheric conditions.

A window 50 is sealed in cover 48 so as to be aligned with lens block 46. Lens block 46 redirects light from laser 45 at a ninety degree angle out through window 50 and may include one or more lenses or optical surfaces, as will be explained in more detail below. Further, lens block 46 may be molded from plastic for convenience in manufacturing.

Optoelectric package 12 is affixed to receptacle assembly 11 with flange 22 of ferrule 20 butting against the upper surface of cover 48. Further, optoelectric package 12 is optically aligned with receptacle assembly 11 so that light from laser 45 is directed into core 15 of optical fiber 14. This alignment can be accomplished in different ways but one reliable method is known as active alignment. In this process, laser 45 is activated and receptacle assembly 11 is positioned approximately over optoelectric package 12. The light in optical fiber 14 is measured and the alignment is adjusted for maximum light. When maximum light is measured alignment has been achieved and receptacle assembly 11 is fixed to optoelectric package 12 by some convenient means, such as welding or adhesive.

Turning to FIG. 2, a simplified sectional view is illustrated of another embodiment of an optoelectric package 112 in accordance with the present invention. It will be understood that optoelectric package 112 is a replacement for optoelectric package 12 of optical/electrical module 10 and operates in conjunction with receptacle assembly 11, or the like, in a substantially similar process. Package 112 includes a mounting structure 114 with one or more base or support plates 115 and a mounting plate 116. In this embodiment, mounting plate 116 (and support plate 115, if desired) may be, for example, a laminated ceramic plate, a common semiconductor substrate, or the like with connecting traces and mounting pads built-in.

A laser 120, which may be for example a Fabry Perot (edge emitting) laser, a distributed feedback laser, or any other convenient laser, is mounted on mounting plate 116 so as to emit light to a lens block 122. Lens block 122, which may include lens or other optical features as described above in conjunction with FIG. 1, diverts the light ninety degrees through a lens 123 and thence into a receptacle assembly (e.g. assembly 11 of FIG. 1). Lens 123 is fixedly held in one end of a mounting assembly or can 124, which has an open second end mounted on base or support plates 115. Can 124 can be formed of metal or the like and may be hermetically sealed to base or support plates 115 (e.g. by welding or the like, as described above) with lens 123 hermetically sealed therein.

A driver 125 (illustrated as a single block but which may contain one or more blocks or elements) is mounted on mounting plate 116 and coupled to laser 120 through traces in mounting plate 116. External connections to driver 125 may be made through traces, openings, or by way of transmission lines (see copending provisional application entitled "Optical/Electrical Module" filed on Mar. 12, 2001 and incorporated herein by reference) through base or support plates 115. Because driver 125 is mounted very close to laser 120 (potentially even on the same semiconductor chip) and any other electronics required in package 112, this embodiment is very good for high frequency designs and can greatly reduce the amount of RF driving power required due to reduced package parasitics.

Turning to FIG. 3, a modification is illustrated in which components similar to those in FIG. 2 are designated with similar numbers. In this embodiment, laser 120 is mounted on mounting plate 116 so as to direct a generated light beam onto lens block 122 and thence through lens 123. Driver 125 and any other electronics utilized (illustrated as two blocks but which may contain one or more blocks or elements) are mounted on the rear surface of base or support plates 115. External connections to driver 125 may be made by wire bonds, straps, flex leads, etc. Connections between driver 125 and laser 120 or any other electronic components on the opposite side of base or support plates 115 are made through traces, openings, or by way of transmission lines (see copending provisional application entitled "Optical/Electrical Module" filed on Mar. 12, 2001) through base or support plates 115.

Turning to FIG. 4, a still further modification is illustrated in which driver 125 (illustrated as two blocks but which may contain one or more blocks or elements) is mounted on a flex lead 130. Flex lead 130 is mounted flat on the rear surface of base or support plates 115. Connections to laser 120 or any other electronic components mounted on the opposite side of base or support plates 115 are made through traces, openings, or by way of transmission lines (see copending provisional application entitled "Optical/Electrical Module" filed on 12 Mar. 2001) through base or support plates 115 and directly to flex lead 130. Flex lead 130 also provides external connections for driver 125 to remotely located circuitry (not shown). Because driver 125 is mounted very close to laser 120 (in either of the embodiments illustrated in FIGS. 3 and 4) and any other electronics required in package 112, this embodiment is very good for high frequency designs and can greatly reduce the amount of driving power required.

Turning to FIG. 5, a simplified sectional view is illustrated of another embodiment of an optoelectric package 212 in accordance with the present invention. Components in package 212 which are similar to those in FIG. 2 are designated with similar numbers. In this embodiment, the laser, designated 120', is a vertical cavity surface emitting laser (VCSEL) which emits light directly along the optical or Z axis through lens 123. A lens 132, which may be for example a molded lens, is positioned adjacent laser 120' to provide initial optical power. It will be understood that the entire mounting assembly and lens 132 can be molded in a single unit or lens 132 can be positioned in a separate mounting structure if desired. In this embodiment, drivers and other electronics can be mounted as described in conjunction with FIG. 2, 3, or 4, as desired or convenient.

Turning to FIG. 6, a simplified sectional view is illustrated of another embodiment of an optoelectric package 312 in accordance with the present invention. Components in package 312 which are similar to those in FIG. 2 are designated with similar numbers. In this embodiment, laser 120, which may be for example a Fabry Perot (edge emitting) laser, a distributed feedback laser, or any other convenient laser, is mounted on the side of a mounting pillar 135 so as to emit light directly along the optical or Z axis through lens 123. Because of the novel mounting of laser 120, ninety degree diverting or reflection is not required, which can simplify the assembly and optics of this structure. Further, there is less likelihood of light losses and, therefore, less laser power is required.

Referring additionally to FIG. 7, laser 120 is mounted on one surface of a flex lead 136, with the opposite surface adjacent one end affixed to mounting pillar 135 so that laser 120 emits light directly along the optical or Z axis through lens 123. Flex lead 136 is bent at approximately ninety degrees and is mounted adjacent the opposite end to the surface of base or support plates 115. Driver 125 (illustrated as a single block but which may contain one or more blocks or elements) is mounted on the same surface of flex lead 136 as laser 120 and is connected to laser 120 through flex lead 136. Connections to flex lead 136 are made through electrical traces, openings, or by way of transmission lines (see copending provisional application entitled "Optical/Electrical Module" filed on Mar. 12, 2001) through base or support plates 115 and directly to flex lead 136. It will be noted that mounting plate 116 is not used in this embodiment since all mounting and connections are achieved through flex lead 136.

Referring additionally to FIGS. 8 and 9, another embodiment is illustrated in which a modified mounting pillar, designated 135', is used. Pillar 135' includes a stiff support component 140 and a component 141 having electrical traces and mounting pads formed thereon. Components 140 and 141 may be separate elements or formed as a single unit (e.g. pillar 135' could be formed as a single laminated ceramic element with circuitry formed therein), depending upon the specific material utilized. Component 141 may be, for example, a printed circuit board, a semiconductor substrate (or chip), a laminated ceramic structure, or the like. Support component 140 and component 141 are affixed together by lamination, glue, etc. (if not formed as a single unit) and laser 120 is mounted directly on component 141 and electrically attached to the traces. Mounting pillar 135' is mounted in a recess in mounting plate 116, as best seen in FIG. 9. Filets 142 of solder or other conducting material are formed between mounting pillar 135' and traces on the upper surface of mounting plate 116 to provide electrical connections to laser 120 and, if desired, to fixedly attach pillar 135' to mounting plate 116.

Turning now to FIG. 10, a simplified sectional view is illustrated of a complete optical/electrical module 410 including a receptacle assembly 411 and an optoelectric package 412 aligned and affixed together generally as described with reference to module 10 of FIG. 1. Receptacle assembly 411 is designed to receive an optical fiber 414 in communication therewith. In the preferred embodiment, optical fiber 414 is a single mode fiber including a glass core 415 and a cladding layer 416. Receptacle assembly 411 includes an elongated cylindrical ferrule 420 defining a fiber receiving opening 421 at one end and adapted to be affixed at the opposite end to a surface of a mounting structure 440 with one or more base or support plates 442 and a mounting plate 443.

Ferrule 420 has a radially outward directed step 424 formed in the outer periphery to operate as a stop for a resilient sleeve 425. Sleeve 425 has an inwardly directed flange formed adjacent one end so as to engage step 424 and prevent relative longitudinal movement between ferrule 420 and sleeve 425. Sleeve 425 also includes radially outwardly directed ribs or protrusions 426 in the outer periphery which are designed to frictionally engage the inner periphery of a mounting housing 430. Thus, to easily and conveniently mount module 410 in housing 430, ferrule 420 with sleeve 425 engaged thereover is press-fit into the circular opening in housing 430 and frictionally holds module 410 in place. Preferably, sleeve 425 is formed, completely or partially, of some convenient resilient material and may be electrically conductive or non-conductive as required in the specific application.

In this embodiment, mounting plate 443 may be, for example, a laminated ceramic plate, a common semiconductor substrate, or the like with connecting traces and mounting pads built-in. A VCSEL 445 is mounted on mounting plate 443 so as to emit light directly along the optical or Z axis into receptacle assembly 411. A lens 446, which may be for example a molded lens, is positioned adjacent laser 445 to provide initial optical power. It will be understood that the entire mounting assembly and lens 446 can be molded in a single unit or lens 446 can be positioned in a separate mounting structure if desired. In this embodiment, drivers and other electronics can be mounted as described in conjunction with FIG. 2, 3, or 4, as desired or convenient.

A tubular spacer 447 is affixed at one end to mounting plate 443 and a window 448 is affixed to the other end. The outer edge or periphery of window 448 is positioned in abutting engagement with step 424 of ferrule 420 and may be held in position by this engagement. To provide EMI protection, the inner surface of ferrule 420 can be plated with some convenient metal or ferrule 420 can be formed of metal. In the event that a hermetic seal is desired, the outer edge or periphery of window 448 is sealed (designated 450) to step 424 of ferrule 420. As illustrated in FIG. 11, window 448 can be formed of a conductive glass to aid in the EMI screening or protection and can, in some embodiments, be fixed directly to step 424 of ferrule 420 without the use of tubular spacer 447.

Referring additionally to FIG. 12, a modified window 448' is illustrated which includes a plastic window 452 with layers 453 of material, such as oxides, nitrides, etc., formed on the surface adjacent step 424 of ferrule 420 to provide for hermetic sealing. In some embodiments, the thicknesses of layers 453 can be adjusted (e.g. to some partial wavelength of the operating frequency or a frequency to be eliminated) to provide some filtering to reduce, for example, reflection and/or return light. In some embodiments, the thicknesses of layers 453 can be adjusted (e.g. to some partial wavelength of the operating frequency) to provide a slight reflection to a monitor diode (not shown) situated on mounting plate 443. Various positions for the monitor diode are illustrated and described in a copending provisional application, entitled "Optical/Electrical Module" filed on Mar. 12, 2001 and incorporated herein by reference).

Turning now to FIG. 13, a simplified sectional view is illustrated of a complete optical/electrical module 510 including a receptacle assembly 511 and an optoelectric package 512 aligned and affixed together generally as described with reference to module 10 of FIG. 1. Receptacle assembly 511 is designed to receive an optical fiber 514 in communication therewith. In the preferred embodiment, optical fiber 514 is a single mode fiber including a glass core 515 and a cladding layer 516. Receptacle assembly 511 includes an elongated cylindrical ferrule 520 defining a fiber receiving opening 521 at one end and adapted to be affixed at the opposite end to a surface of a mounting structure 540 with one or more base or support plates 542 and a mounting plate 543.

Ferrule 520 has a radially outward directed step 524 formed in the outer periphery to operate as a stop for a resilient sleeve 525. Sleeve 525 has an inwardly directed flange formed adjacent one end so as to engage step 524 and prevent relative longitudinal movement between ferrule 520 and sleeve 525. Sleeve 525 also includes radially outwardly directed ribs or protrusions 526 in the outer periphery which are designed to frictionally engage the inner periphery of a mounting housing 530. Thus, to easily and conveniently mount module 510 in housing 530, ferrule 520 with sleeve 525 engaged thereover is press-fit into the circular opening in housing 530 and frictionally holds module 510 in place. Preferably, sleeve 525 is formed, completely or partially, of some convenient resilient material and may be electrically conductive or non-conductive as required in the specific application.

In this embodiment, mounting plate 543 may be, for example, a laminated ceramic plate, a common semiconductor substrate, or the like with connecting traces and mounting pads built-in. A VCSEL 545 is mounted on mounting plate 543 so as to emit light directly along the optical or Z axis into receptacle assembly 511. A lens 558, which may be for example a molded lens, is positioned between laser 545 and receptacle assembly 511 to provide initial optical power. It will be understood that the entire lens mounting assembly and lens 558 can be molded in a single unit, as shown, or lens 558 can be positioned in a separate mounting structure if desired. In this embodiment, drivers and other electronics can be mounted as described in conjunction with FIG. 2, 3, or 4, as desired or convenient.

In this embodiment, ferrule 520 is molded plastic and a centrally located conductive layer 550 is sandwiched between layers of plastic to provide EMI protection or screening. The centrally located conductive layer 550 can also provide a hermetic seal in some instances. For example, to increase EMI screening and hermeticity, layer 542 of mounting structure 540 can be formed of metal or can be completely or partially plated with metal, designated 552. Also, lens 558 can be formed of glass (conductive for EMI screening) or of plastic with layers of oxide or nitride, as described above. Lens 558 is then sealed to step 524 of ferrule 520 and/or mounting plate 543, generally as described above, to provide EMI protection and/or hermeticity.

Figures 14, 15:
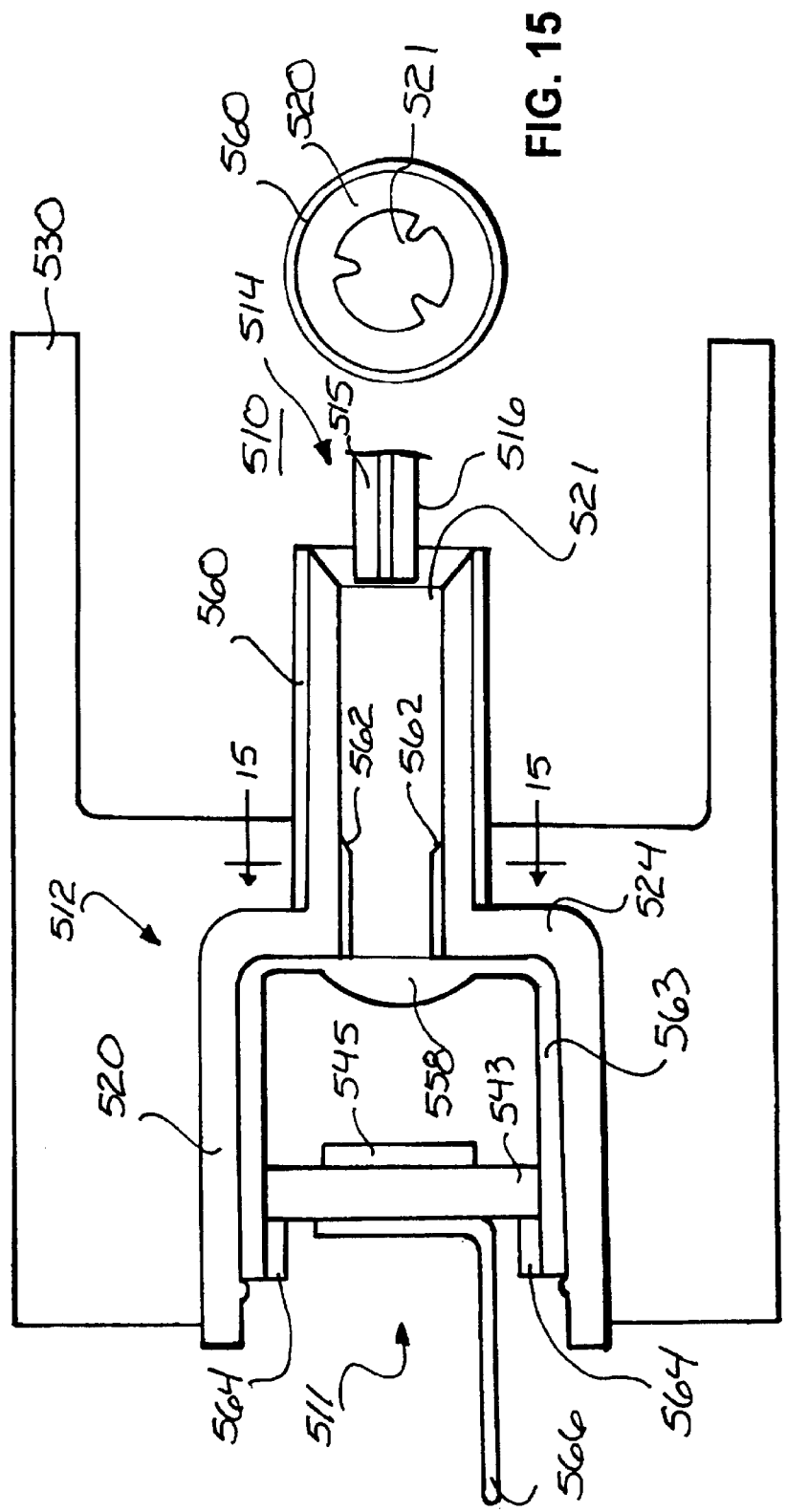
FIG. 14 is a simplified sectional view illustrating some modifications to the apparatus of FIG. 13.
FIG. 15 is a sectional view as seen from the line 15—15 of FIG. 14.

Referring additionally to FIGS. 14 and 15, several modifications to optical/electrical module 510 and housing 530 are illustrated. In this embodiment, housing 530 is constructed with an opening designed to receive ferrule 520 directly, without the use of sleeve 525. It should be noted that sleeve 525 can be incorporated as described above and, if formed of electrically conductive material, will operate generally in accordance with this description. If sleeve 525 is used, housing 530 is constructed with an opening therethrough as described in conjunction with FIG. 13. Housing 530 is constructed of metal or other electrically conducting material and a layer 560 of metal is provided on the outer surface of at least the portion of ferrule 520 adjacent optical fiber receiving opening 521. Layer 560 contacts housing 530 to provide continuous EMI screening or protection for module 510 and to ensure a tight tolerance on opening 521.

Ferrule 520 is molded or otherwise conveniently formed of plastic and crush ribs 562 are provided in the inner periphery of the portion of ferrule 520 adjacent optical fiber receiving opening 521. See FIG. 15 for a sectional view. Crush ribs 562 not only serve to allow a greater tolerance in the manufacturing process, but they tend to center optical fiber 514 within the receiving opening and to frictionally lock it in place.

In this embodiment, lens 558 is formed as a generally cup-shaped plastic element 563 with lens 558 positioned in the bottom of the cup and aligned along the optical or Z axis. Crush ribs 564 are formed in the inner periphery of cup-shaped plastic element 563 adjacent the rim or exterior end. Mounting plate 543, with VCSEL 545 (or other laser and driver, if desired) mounted thereon is provided. In this embodiment, as an example of an easily assembled structure, a flex lead 566 is attached to the rear surface of mounting plate 543 (see FIG. 4 for other structures) to provide external contacts to VCSEL 545 and any other electronics mounted thereon. Mounting plate 543, with VCSEL 545 and flex lead 566 attached, is simply pressed into the opening in cup-shaped plastic element 563. Crush ribs 564 not only center but frictionally engage mounting plate 543 in the opening. To provide for a more secure engagement of mounting plate 543, mounting plate 543 can be provided with longitudinally extending channels in the periphery that mate with crush ribs 564. Mounting plate 543 can then be inserted into the opening in cup-shaped plastic element 563 and rotated to lock it firmly in place. It should be understood that additional or alternative fixing or mounting structure, such as welding, soldering. adhesive, etc., can be used if desired or deemed more appropriate.

Turning now to FIGS. 16 and 17, a simplified side view and top plan, respectively, are illustrated of another embodiment of mounting structure for electronics in an optical/electrical module in accordance with the present invention. In this embodiment, laser 545, which is preferably a VCSEL but can be any of the above described lasers (e.g. a VCSEL, a Fabry Perot (edge emitting) laser, a distributed feedback laser, or any other convenient laser), is mounted directly on a driver chip 570 by solder bumps 571 or any other convenient process. Driver chip 570 is then mounted on mounting plate 543 by solder bumps 572 or any other convenient process including flex leads, etc. In the preferred embodiment illustrated, mounting plate 543 includes mounting pads and electrical traces for receiving driver chip 570 and connecting it to external circuitry. Mounting plate 543 could include, for example, printed circuit board, laminated ceramic chip, or the like.

Turning now to FIG. 18, a simplified sectional view is illustrated of a complete optical/electrical module 610 including a receptacle assembly 611 and an optoelectric package 612 affixed together. Receptacle assembly 611 is designed to receive an optical fiber 614 in communication therewith. In the preferred embodiment, optical fiber 614 is a single mode fiber including a glass core 615 and a cladding layer 616. Receptacle assembly 611 includes an elongated cylindrical ferrule 620 having a longitudinally extending bore therethrough defining a fiber receiving opening 621 at one end. Ferrule 620 is affixed at the opposite end to a mounting block 622. In this embodiment mounting block 622 also fixedly attaches one end of a flexible coupling optical element 624 (e.g. an optical fiber) into the bore in ferrule 620 opposite fiber receiving opening 621. Optical fiber 614 is optically aligned with optical element 624 by the bore through ferrule 620.

The opposite end of optical element 624 passes through an opening in a housing 625 of optoelectric package 612 and is held fixedly in place by a mounting and alignment block 626. A laser, which is preferably an edge emitting laser but can be any of the above described lasers (e.g. a VCSEL, a Fabry Perot (edge emitting) laser, a distributed feedback laser, or any other convenient laser), is mounted on a mounting plate 643 along with a driver 647 and any other electronics. As described above, mounting plate 643 includes mounting pads and electrical traces for mounting and interconnecting and could include, for example, printed circuit board, laminated ceramic chip, or the like. Mounting and alignment block 626 is mounted on mounting plate 643 so as to align the end of optical element 624 with the light output of laser 645. The alignment of optical element 624 with the light output of laser 645 can be accomplished by, for example, active alignment as described above.

Referring additionally to FIG. 19, a fiber clip 650 is illustrated which includes a body 652 with a bore 653 extending longitudinally therethrough. Body 652 defines a slot 655 adjacent an inlet end of bore 653. In a preferred embodiment, bore 653 has an inner diameter slightly smaller than an outer diameter of an optical fiber 656. When optical fiber 656 is inserted into bore 653, slot 655 provides a slight spring action which grips and aligns optical fiber 656 in bore 653. A slot 658 in body 652 adjacent the outlet opening of bore 653, in this embodiment is designed to grip and align a flat optical fiber 660. It will be understood that the outlet end could be designed similar to the inlet end so that clip 650 aligns and connects two similar optical fibers (e.g. optical fiber 614) or it could be designed to receive and align an element of the system (e.g. a molded lens, an edge of an edge emitting laser, etc.).

Referring additionally to FIG. 20, a modification of receptacle assembly 611, designated 611', is illustrated. In this modification, the bore through ferrule 620' has an inlet end 623' which is flared to easily receive and center optical element 624'. After optical element 624' is positioned within the bore it can be fixed in place by filling the flared area with adhesive, etc. In this embodiment, mounting block 622' simply has an opening for receiving ferrule 620' therein and can be positioned anywhere along the length of ferrule 620'.

In all of the various structures disclosed above, it is often necessary to align the ends of two optical fibers for connecting the two optical fibers in series. Referring additionally to FIG. 21, a first optical fiber 665 and a second optical fiber 666 are illustrated. To join fibers 665 and 666 in series it is necessary to align the cores as closely as possible. A preferred method of aligning the cores is illustrated. In this method light is injected at an opposite end of one of the fibers (e.g. fiber 666) and the ends to be joined are brought close together at a junction. Photo sensitive micro manipulators 668, for example photodiodes on the ends of movable fingers, are used at the junction to urge the ends into alignment.

As illustrated, photo sensitive micro manipulators 668 are constructed to overlap the junction and but against the adjacent ends of both fibers 665 and 666. During any misalignment, light reflects from the end of the opposite fiber, in this example fiber 665, and is received by photo sensitive micro manipulators 668. Thus, for proper alignment, photo sensitive micro manipulators 668 adjust the adjacent ends for minimum light reflection. Here it will be understood that photo sensitive micro manipulators 668 could simply be the sensors (e.g. photodiodes or the like) and fingers 669 or other fiber manipulators could grip one of the fibers a slight distance from the junction so as to manipulate the griped fiber (e.g. fiber 666) relative to a stationary fiber (e.g. fiber 665). Once the fibers are properly aligned they can be joined by adhesive or the like surrounding the juncture.

Figure 22:
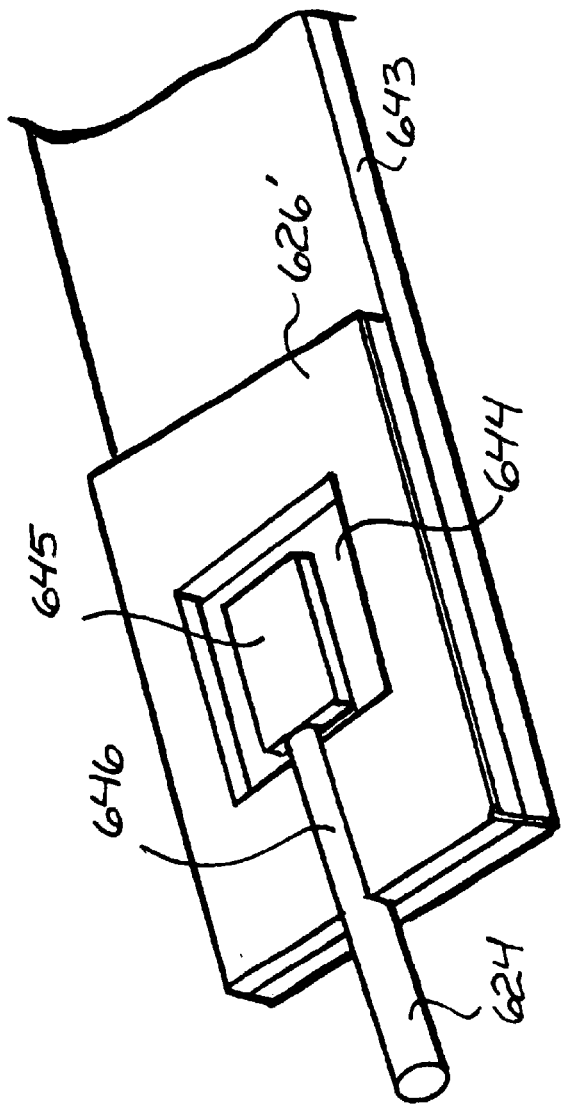
FIG. 22 is a perspective view of mounting and alignment apparatus for use in an optical/electrical module such as that illustrated in FIG. 18.

Referring additionally to FIG. 22, mounting apparatus for positioning and aligning laser 645 with optical element 624 is illustrated. In this embodiment, a mounting and alignment block 626' is positioned on mounting plate 643. Mounting and alignment block 626' has a central opening 644 larger than laser 645 and a channel or groove 646 extending from the front edge into communication with opening 644. Groove 646 is designed to receive and retain optical element 624 therein. In operation either laser 645 or mounting and alignment block 626' can be moved relative to the other to align optical element 624 with the light output of laser 645. By accurately forming opening 644 and groove 646, for example by photo etching or the like, initial alignment will be very close and only minor adjustments may provide the final alignment. By utilizing standard semiconductor techniques, e.g. photo etching and/or patterning during growth of block 626', the illustrated embodiment can be formed with groove 646 accurately aligned with laser 645 so that no additional alignment is required.

In this embodiment, laser 645 is mounted on mounting pads on the surface of mounting plate 643 so that mounting and alignment block 626' becomes the movable element. Optical element 624 extends slightly into opening 644 and mounting and alignment block 626' is manipulated in the X and Y axes (in a plane parallel to the upper surface of mounting plate 643) until alignment is achieved, generally using active alignment procedures. Mounting and alignment block 626' is then fixed to mounting plate 643 by some convenient means, such as adhesive, welding, solder, etc.

Figure 23:
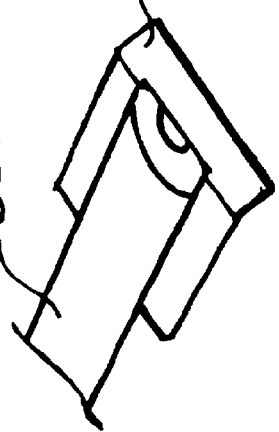
FIG. 23 is a perspective view of another embodiment of mounting and alignment apparatus in accordance with the present invention.

In yet another alignment method illustrated in FIG. 23, optical element 624, which is an optical fiber in this example, is bisected adjacent the end to expose the core. Laser 645 is constructed so that a portion of the light amplifying channel (generally, in this example, laser 645 is an edge emitting laser) is exposed. The exposed core of optical element 624 is then aligned over and parallel to the exposed light channel of laser 645. Because the core of optical element 624 is adjacent and parallel to the exposed light channel of laser 645, light is coupled directly into optical element 624 from laser 645.

Figure 25:
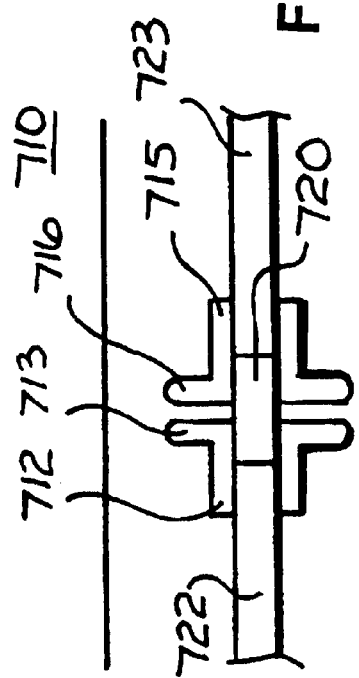
FIG. 25 is a sectional view of a portion of the optical/electrical module of FIG. 24.
Figure 24:
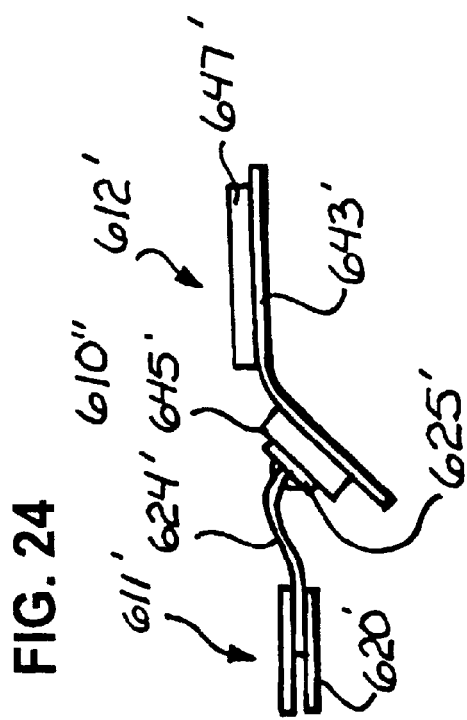
FIG. 24 is a simplified sectional view of another embodiment of an optical/electrical module in accordance with the present invention.

Turning now to FIGS. 24 and 25, a different embodiment of module 610, designated 610' is illustrated. In this embodiment, components which are similar to components in module 610 of FIG. 18 are designated with similar numbers and a prime is added to indicate the different embodiment. All similar components will not be discussed in detail but are assumed to be similar to the components already described. In this embodiment, laser 645' and driver 647' are mounted on a flex strip 643', which provides interconnections and external connections to other circuitry. Also, laser 645' is a VCSEL rather than en edge emitter.

Optical element 624', which couples the output of laser 645' into ferrule 620' of receptacle assembly 611', extends through an opening in the top of a housing 625' (see FIG. 25) to but against the upper surface of laser 645'. Alignment of optical element 624' with the light outlet of laser 645' can be achieved by active alignment or through accurate production of housing 625'. Housing 625' can be filled with a hydrophobic material to protect laser 645' from moisture and to hold optical element 624' in place.

Figure 26:
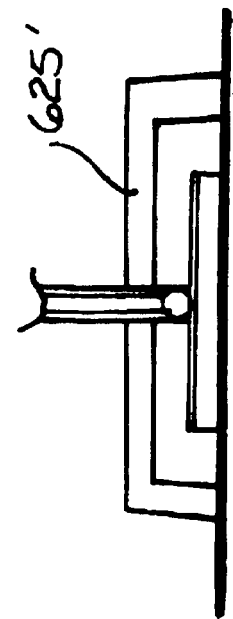

Turning to FIG. 26, another optical fiber alignment apparatus 710 is illustrated in a simplified sectional view. In apparatus 710, a first cylindrically shaped ferrule 712 including a radially outwardly extending flange 713 adjacent one end, is provided. A second cylindrically shaped ferrule 715 including a radially outwardly extending flange 716 adjacent one end, is provided. A small cylinder 720 of optically clear material is inserted partially into each ferrule 712 and 715 at the flanged ends. Cylinder 720 is preferably formed of a non wetting material so that moisture will not accumulate in the junction. One end of a first optical fiber 722 is inserted into ferrule 712 and one end of a second optical fiber 723 is inserted into ferrule 715. Preferably, the openings through ferrules 712 and 715 are of a size to frictionally engage optical fibers 722 and 723 and cylinder 720 so that no additional material (e.g. adhesive or the like) is required. However, if desired it will be understood that the entire junction, that is flanges 713 and 716 along with any exposed portions of cylinder 720, can be covered with an epoxy or other adhesive to fix apparatus 710 in the assembled mode.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is.

What is claimed is:

1. A TO-can-type optoelectric assembly comprising:
    a TO-can having a first end with an optical element therein for conducting light therethrough and a second end, the first and second ends defining an optical axis;
    a base affixed to the second end of the TO-can;
    a laser affixed to the base so that light generated by the laser is directed through the optical element in the first end generally along the optical axis;
    a laser driver affixed to the base and electrically connected to[]the laser by one of electrical traces on a surface of the base, vias through at least a portion of the base, and flexible leads mounted at least partially on the base; and
    external connections to the laser driver by one of electrical traces on a surface of the base, vias through at least a portion of the base, and flexible leads mounted at least partially on the base.

2. A TO-can-type optoelectric assembly as claimed in claim 1 wherein the base includes at least a laminated ceramic portion.

3. A TO-can-type optoelectric assembly as claimed in claim 2 wherein the laser and the laser driver are mounted on a surface of the laminated ceramic portion contained inside of the TO-can.

4. A TO-can-type optoelectric assembly as claimed in claim 3 including in addition a monitor diode mounted on the surface of the laminated ceramic portion contained inside of the TO-can adjacent to the laser.

5. A TO-can-type optoelectric assembly as claimed in claim 2 wherein the laser is mounted on a surface of the laminated ceramic portion contained inside of the TO-can and the laser driver is mounted on an opposed surface of the laminated ceramic portion.

6. A TO-can-type optoelectric assembly as claimed in claim 5 additionally including a flex lead having a portion attached to the opposed surface and a portion extending from the opposed surface for providing external electrical connections, the laser driver being affixed to the portion of the flex lead attached to the opposed surface.

7. A TO-can-type optoelectric assembly as claimed in claim 1 wherein the laser is mounted on a surface of the base inside of the TO-can and a lens block is mounted on the base adjacent the laser for receiving light from the laser and directing the light through the optical element in the first end of the TO-can.

8. A TO-can-type optoelectric assembly as claimed in claim 1 wherein the laser is mounted on a mounting pillar positioned generally parallel to the optical axis and having one end affixed to the surface of the base inside of the TO-can so that light from the laser is directed through the optical element in the first end of the TO-can generally along the optical axis.

9. A TO-can-type optoelectric assembly as claimed in claim 8 wherein the laser is electrically connected to the laser driver by means of electrical traces formed on a surface of the mounting pillar and electrically conductive fillets formed between the mounting pillar and the base.

10. A TO-can-type optoelectric assembly as claimed in claim 1 including in addition a mounting pillar positioned generally parallel to the optical axis and having one end affixed to the surface of the base inside of the TO-can and a flex lead extending from the base along a surface of the mounting pillar, and a laser affixed on the flex lead so that light from the laser is directed through the optical element in the first end of the TO-can generally along the optical axis.

11. A TO-can-type optoelectric assembly as claimed in claim 10 wherein the laser driver is affixed to the flex lead on the base.

12. A TO-can-type optoelectric assembly as claimed in claim 1 wherein the TO-can is hermetically sealed by the optical element at the first end and is hermetically sealed to the base at the second end.

13. A TO-can-type optoelectric assembly as claimed in claim 1 including an additional optical element mounted between the laser and the optical element in the first end of the TO-can.

14. A TO-can-type optoelectric assembly as claimed in claim 1 wherein the laser driver is fabricated on a semiconductor die and the laser is physically and electrically connected to the laser driver semiconductor die, the laser driver semiconductor die is physically and electrically connected to the one of electrical traces on a surface of the base, vias through at least a portion of the base, and flexible leads mounted at least partially on the base.

15. An optoelectric assembly comprising:
    a first semiconductor chip including one of a laser and an optical detector;
    a second semiconductor chip including one of a laser driver and an amplifier;
    the first semiconductor chip being mounted on the second semiconductor chip so that the one of the laser and the optical detector are physically and electrically connected to the one of the laser driver and the amplifier, respectively; and a base having the second semiconductor chip affixed thereto, the base including external connections to the second semiconductor chip by one of electrical traces on a surface of the base, vias through at least a portion of the base, and flexible leads mounted at least partially on the base.

16. An optoelectric assembly as claimed in claim 15 including in addition a cylindrical ferrule defining an optical axis and having a first end constructed to receive an optical fiber aligned along the optical axis and a second end, the base being affixed to the second end of the cylindrical ferrule.

17. An optoelectric assembly as claimed in claim 15 wherein the second semiconductor chip includes a cavity having the first semiconductor chip mounted therein.

18. An optoelectric assembly as claimed in claim 17 wherein the second semiconductor chip includes an etched groove in communication with the cavity, the groove being designed to receive and optically align an optical fiber with the one of the laser and the optical detector on the first semiconductor chip mounted in the cavity.

19. An optoelectric module comprising:
- a cylindrical ferrule defining an optical axis and having a first end constructed to receive an optical fiber aligned along the optical axis and a second end;
- a TO-can positioned within the ferrule and having a first end with an optical element therein for conducting light therethrough and a second end, the first and second ends being positioned along the optical axis;
- a base affixed to the second end of the TO-can and to the second end of the ferrule;
- a laser mounted on the base within the TO-can so that light generated by the laser is directed through the optical element in the first end generally along the optical axis;
- a laser driver mounted on the base and electrically connected to the laser by one of electrical traces on a surface of the base, vias through at least a portion of the base, and flexible leads mounted at least partially on the base; and
- external connections to the laser driver by one of electrical traces on a surface of the base, vias through at least a portion of the base, and flexible leads mounted at least partially on the base.

20. An optoelectric module as claimed in claim 19 wherein the ferrule is constructed with a shoulder circumferentially around the optical axis between the first and second ends and an optical element is positioned in abutting engagement with the shoulder in the optical axis.

21. An optoelectric module as claimed in claim 20 wherein the optical element positioned in abutting engagement with the shoulder is sealed to the shoulder to provide a hermetic seal between the first end and the second end of the ferrule.

22. An optoelectric module as claimed in claim 21 wherein the optical element positioned in abutting engagement with the shoulder includes one of an oxide and a nitride to provide hermeticity.

23. An optoelectric module as claimed in claim 21 wherein the optical element positioned in abutting engagement with the shoulder includes layers of material selected to provide partial reflection of a portion of the light generated by the laser back to a monitor diode positioned within the ferrule.

24. An optoelectric module as claimed in claim 21 wherein the optical element positioned in abutting engagement with the shoulder includes electrically conductive material for providing EMI screening between the first and second ends of the ferrule.

25. An optoelectric module as claimed in claim 19 wherein the cylindrical ferrule includes a metal layer for EMI screening.

26. An optoelectric module as claimed in claim 25 wherein at least a portion of an inner surface of the cylindrical ferrule is plated with metal.

27. An optoelectric module as claimed in claim 24 wherein the cylindrical ferrule the TO-can is electrically connected to the metal plated portion of the cylindrical ferrule and the base includes a metal layer electrically connected to one of the TO-can and the metal plated portion of the cylindrical ferrule to completely enclose the optoelectric module for EMI screening.

28. An optoelectric module as claimed in claim 25 wherein the cylindrical ferrule is molded and includes two layers of plastic with a metal layer sandwiched therebetween.

29. An optoelectric module as claimed in claim 19 including in addition crush ribs positioned on a surface of the cylindrical ferrule within the first end to receive and fixedly hold the optical fiber.

* * * * *